United States Patent
Lee et al.

(10) Patent No.: US 11,329,623 B2
(45) Date of Patent: May 10, 2022

(54) BULK-ACOUSTIC WAVE RESONATOR AND BULK-ACOUSTIC WAVE FILTER DEVICE

(71) Applicant: Samsung Electro-Mechanics Co., Ltd., Suwon-si (KR)

(72) Inventors: Tae Kyung Lee, Suwon-si (KR); Won Han, Suwon-si (KR); Sang Uk Son, Suwon-si (KR); Hwa Sun Lee, Suwon-si (KR); Moon Chui Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 24 days.

(21) Appl. No.: 16/934,265

(22) Filed: Jul. 21, 2020

(65) Prior Publication Data
US 2021/0313958 A1 Oct. 7, 2021

(30) Foreign Application Priority Data

Apr. 3, 2020 (KR) .................. 10-2020-0040837

(51) Int. Cl.
*H03H 9/02* (2006.01)
*H03H 9/205* (2006.01)
*H03H 9/13* (2006.01)
*H03H 9/54* (2006.01)

(52) U.S. Cl.
CPC .... *H03H 9/02157* (2013.01); *H03H 9/02015* (2013.01); *H03H 9/131* (2013.01); *H03H 9/205* (2013.01); *H03H 9/54* (2013.01)

(58) Field of Classification Search
CPC .... H03H 9/205; H03H 9/131; H03H 9/02157; H03H 9/02015; H03H 9/54
USPC .......................................... 333/133, 187, 188
See application file for complete search history.

(56) References Cited

U.S. PATENT DOCUMENTS

| | | | |
|---|---|---|---|
| 6,909,340 B2 | 6/2005 | Aigner et al. | |
| 7,629,865 B2 * | 12/2009 | Ruby ..................... | H03H 9/564 333/189 |
| 2007/0120624 A1 | 5/2007 | Milsom et al. | |
| 2018/0062608 A1 * | 3/2018 | Lee ......................... | H03H 9/605 |
| 2019/0386641 A1 * | 12/2019 | Lee ......................... | H03H 9/174 |
| 2020/0076403 A1 * | 3/2020 | Jhung ..................... | H03H 9/171 |

FOREIGN PATENT DOCUMENTS

KR 10-1323447 B1 10/2013

\* cited by examiner

*Primary Examiner* — Rakesh B Patel
*Assistant Examiner* — Jorge L Salazar, Jr.
(74) *Attorney, Agent, or Firm* — NSIP Law

(57) ABSTRACT

A bulk-acoustic wave resonator includes a substrate, a first electrode disposed on the substrate, a piezoelectric layer covering at least a portion of the first electrode, and a second electrode covering at least a portion of the piezoelectric layer. When an active region, in which the first electrode and the second electrode are disposed to overlap each other, is viewed from above, among four sides of a rectangle with which at least three vertices of a polygon formed by the active region are in contact, a longest side is defined as a side B and a side connected to side B is defined as a side A, and an aspect ratio (side B/side A) is 1.3 to 3.

17 Claims, 8 Drawing Sheets

BULK-ACOUSTIC WAVE RESONATOR AND BULK-ACOUSTIC WAVE FILTER DEVICE

CROSS-REFERENCE TO RELATED APPLICATION(S)

This application claims the benefit under 35 USC 119(a) of Korean Patent Application No. 10-2020-0040837 filed on Apr. 3, 2020 in the Korean Intellectual Property Office, the entire disclosure of which is incorporated herein by reference for all purposes.

BACKGROUND

1. Field

This application relates to a bulk-acoustic wave resonator and a bulk-acoustic wave filter device.

2. Description of Related Art

In accordance with the emergence of 5th generation (5G) communications, development of a bulk-acoustic wave (BAW) filter for 5G has been conducted. The BAW filter for 5G has a bandwidth significantly wider than that of an existing filter and a communications distance shorter than that of the existing filter, and strength of a signal, power is thus increased.

As thicknesses of upper and lower electrodes of a resonator are extremely decreased to implement a BAW filter in sub-6 GHz band, deterioration in resonator insertion loss IL characteristics is unavoidable. In addition, as a resonator has been decreased in size, deterioration in insertion loss IL characteristics may be more serious than in an existing filter.

Accordingly, heat may be severely generated due to an increase in insertion loss IL under high-power conditions. As a result, a structure having poor reliability may be provided.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

A bulk-acoustic wave resonator, capable of inhibiting a decrease in attenuation performance and $Kt^2$ characteristics while reducing insertion loss IL.

In one general aspect, a bulk-acoustic wave resonator includes a substrate, a first electrode disposed on the substrate, a piezoelectric layer covering at least a portion of the first electrode, and a second electrode covering at least a portion of the piezoelectric layer. When active region, in which the first electrode and the second electrode are disposed to overlap each other, is viewed from above, among four sides of the rectangle with which at least three vertices of a polygon formed by the active region are in contact, a longest side is defined as a side B and a side connected to side B is defined as a side A, and an aspect ratio (side B/side A) may be 1.3 to 3.

The bulk-acoustic wave resonator may include a metal pad connected to the first electrode and the second electrode.

The metal pad may include a first metal pad, having an edge portion disposed to cover a portion of the active region, and a second metal pad disposed to oppose the first metal pad.

The first metal pad may be connected to the first electrode, and the second metal pad may be connected to the second electrode.

The bulk-acoustic wave resonator may include a membrane layer or a seed layer disposed between the substrate and the first electrode, and may define a cavity together with the substrate.

The bulk-acoustic wave resonator may include an etching prevention portion disposed to cover the cavity.

The bulk-acoustic wave resonator may include a sacrificial layer disposed outside of the etching prevention portion.

The bulk-acoustic wave resonator may include an insertion layer disposed between the first electrode and the piezoelectric layer.

The piezoelectric layer may be formed of aluminum nitride (AlN) or aluminum nitride (AlN) doped with a dopant.

The dopant may include at least one selected from the group consisting of scandium (Sc), erbium (Er), yttrium (Y), lanthanum (La), titanium (Ti), zirconium (Zr), hafnium (Hf), tantalum (Ta), and niobium (Nb), or combinations thereof.

An area of the active region may be 10000 µm2 or less when the active region is viewed from above.

In another general aspect, a bulk-acoustic wave filter device includes a substrate; a plurality of series resonators disposed on the substrate; and a plurality of shunt resonators connected to the plurality of series resonator on the substrate. In each of the plurality of series resonators and the plurality of shunt resonators, when an active region is viewed from above, among four sides of a rectangle with which at least three vertices of a polygon formed by the active region are in contact, a longest side is defined as a side B and a side connected to side B is defined as a side A, and an aspect ratio (side B/side A) is 1.3 to 3.

The plurality of series resonators may have a larger aspect ratio than the plurality of shunt resonators.

The plurality of series resonators may have a smaller aspect ratio than the plurality of shunt resonators.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
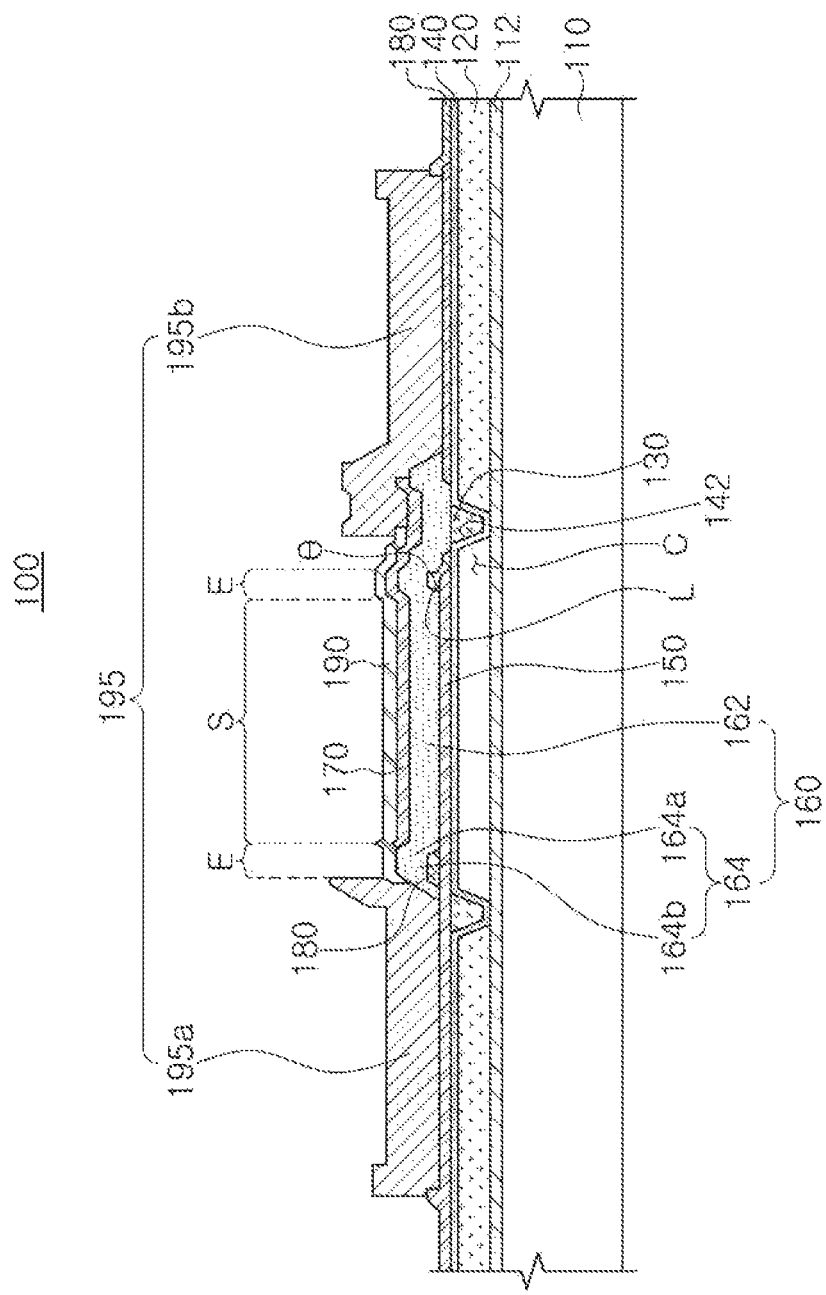
FIG. 1 is a schematic cross-sectional view of a bulk-acoustic wave resonator according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

Hereinafter, examples will be described as follows with reference to the attached drawings.

Figure 2:
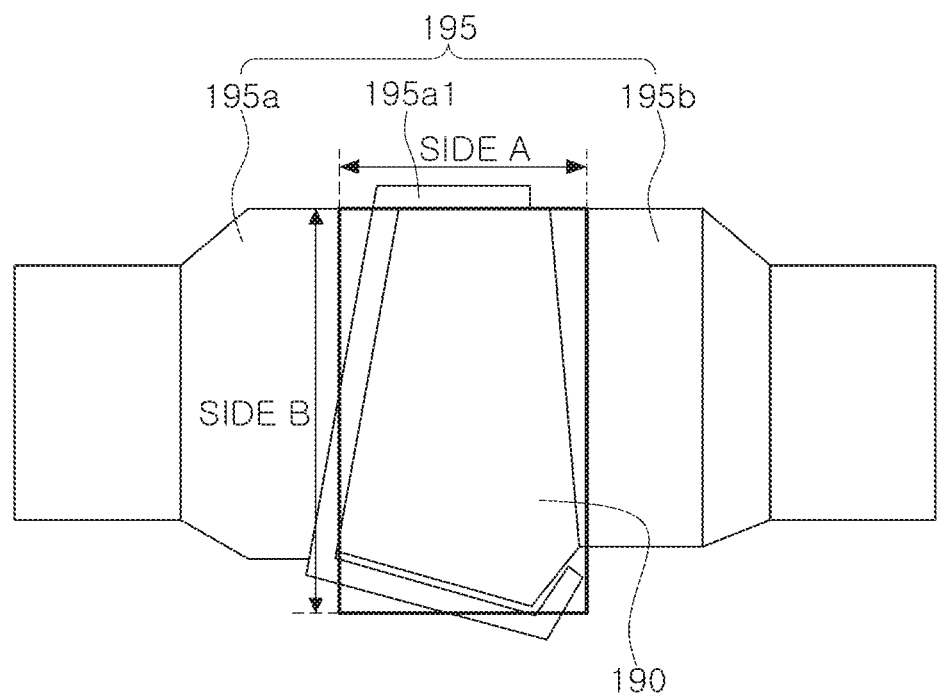
FIG. 2 is a plan view of the bulk-acoustic wave resonator according to an example.

FIG. 1 is a schematic cross-sectional view of a bulk-acoustic wave resonator according to an example, and FIG. 2 is a plan view of the bulk-acoustic wave resonator according to an example.

Referring to FIGS. 1 and 2, a bulk-acoustic wave resonator 100 may include, for example, a substrate 110, a sacrificial layer 120, an etching prevention portion 130, a membrane layer 140, a first electrode 150, a piezoelectric layer 160, a second electrode 170, an insertion layer 180, a passivation layer 190, and a metal pad 195.

The substrate 110 may be a silicon substrate. For example, a silicon wafer or a silicon on insulator (SOI)-type substrate may be used as the substrate 110.

An insulating layer 112 may be formed on an upper surface of the substrate 110, and may electrically insulate a component disposed thereon and the substrate 110 from each other. The insulating layer 112 may serve to prevent the substrate 110 from being etched by an etching gas when a cavity C is formed in a manufacturing process.

In this case, the insulating layer 112 may be formed of at least one of silicon dioxide ($SiO_2$), silicon nitride ($Si_3N_4$), aluminum oxide ($Al_2O_3$), and aluminum nitride (AlN), and may be formed by one of a chemical vapor deposition process, a radio-frequency (RF) magnetron sputtering process, and an evaporation process.

The sacrificial layer 120 may be formed on the insulating layer 112, and the cavity C and the etching prevention portion 130 may be disposed in the sacrificial layer 120. The cavity C may be formed by removing a portion of the sacrificial layer 120 at the time of being manufactured. As described above, the cavity C may be formed inside of the sacrificial layer 120, and thus, the first electrode 150 and the like disposed on the sacrificial layer 120 may be formed to be flat.

The etching prevention portion 130 may be disposed along a boundary of the cavity C. The etching prevention portion 130 may prevent etching from being performed beyond a cavity region during the formation of the cavity C.

The membrane layer 140 may form the cavity C together with the substrate 110. The membrane layer 140 may be formed of a material having low reactivity to an etching gas at the time of removing the sacrificial layer 120. The etching prevention portion 130 may be inserted into and disposed in a groove 142 formed by the membrane layer 140. The membrane layer 140 may be a dielectric layer including one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

A seed layer, not illustrated, formed of aluminum nitride (AlN) may be formed on the membrane layer 140. For example, the seed layer may be disposed between the membrane layer 140 and the first electrode 150. The seed layer may be formed of a dielectric material or a metal having a hexagonal close packed (HCP) grain structure, in addition to aluminum nitride (AlN). As an example, when the seed layer is formed of a metal, the seed layer may be formed of titanium (Ti).

The first electrode 150 may be formed on the membrane layer 140, and may be partially disposed above the cavity C. The first electrode 150 may be used as one of an input electrode or an output electrode inputting and outputting an electrical signal, such as a radio-frequency (RF) signal or the like.

The first electrode 150 may be formed of, for example, an aluminum alloy containing scandium (Sc). Since the first electrode 150 is formed of the aluminum alloy containing scandium (Sc), mechanical strength of the first electrode 150 may be increased, such that high power reactive sputtering may be performed. Under such a deposition condition, surface roughness of the first electrode 150 may be prevented from increasing, and highly oriented growth of the piezoelectric layer 160 may also be induced.

A chemical resistance of the first electrode 150 may be increased by containing scandium (Sc) as a material of the first electrode 150 to address an issue occurring when the first electrode is formed of pure aluminum. Further, stability of a process such as a dry etch process, a wet process, or the like, at the time of manufacturing the bulk-acoustic wave resonator may be secured. In addition, oxidation easily occurs when the first electrode is formed of pure aluminum, but the first electrode 150 may be formed of the aluminum alloy containing scandium (Sc) to improve chemical resistance to the oxidation.

However, the first electrode 150 is not limited to such a composition, and may be formed of, for example, a conductive material such as molybdenum (Mo) or an alloy thereof. However, the first electrode 150 is not limited to such a composition, and may be formed of a conductive material such as ruthenium (Ru), tungsten (W), iridium (Ir), platinum (Pt), copper (Cu), titanium (Ti) tantalum (Ta), nickel (Ni), chromium (Cr), or the like, or alloys thereof.

The piezoelectric layer 160 may be formed to cover at least a portion of the first electrode 150 disposed above the cavity C. The piezoelectric layer 160 may cause a piezoelectric effect to convert electric energy into mechanical energy having an acoustic wave form, and may include, for example, aluminum nitride (AlN).

The piezoelectric layer 160 may be doped with a dopant such as a rare earth metal or a transition metal. As an example, the rare earth metal used as the dopant may include at least one of scandium (Sc), erbium (Er), yttrium (Y), and lanthanum (La). Further, the transition metal used as the dopant may include at least one of titanium (Ti), zirconium (Zr), hafnium (Hf), tantalum (Ta), and niobium (Nb). The piezoelectric layer 160 may also include magnesium (Mg), a divalent metal.

The piezoelectric layer 160 may include a piezoelectric portion 162 disposed in a flat portion S and a bent portion 164 disposed in an extension portion E.

The piezoelectric portion 162 may be a portion directly stacked on an upper surface of the first electrode 150. Therefore, the piezoelectric portion 162 may be interposed between the first electrode 150 and the second electrode 170 and be formed to be flat, together with the first electrode 150 and the second electrode 170.

The bent portion 164 may be defined as a region extending outwardly from the piezoelectric portion 162 to be disposed in the extension portion E.

The bent portion 164 may be disposed on an insertion layer 180, and may have a form protruding along a shape of the insertion layer 180. Therefore, the piezoelectric layer 160 may be bent at a boundary between the piezoelectric portion 162 and the bent portion 164, and the bent portion 164 may protuberate depending on a thickness and a shape of the insertion layer 180.

The bent portion 164 may be divided into an inclined portion 164a and an extended portion 164b.

The inclined portion 164a may refer to a portion inclined along an inclined surface L of the insertion layer 180. The extended portion 164b may refer to a portion extended outwardly from the inclined portion 164a.

The inclined portion 164a may be formed in parallel with an inclined surface L of the insertion layer 180, and an inclined angle of the inclined portion 164a may be the same as an inclined angle θ of the inclined surface L of the insertion layer 180.

The second electrode 170 may be formed to cover at least a portion of the piezoelectric layer 160 disposed above the cavity C. The second electrode 170 may be used as one of an input electrode and an output electrode inputting and outputting an electrical signal, such as a radio-frequency (RF) signal, or the like. For example, when the first electrode 150 is used as the input electrode, the second electrode 170 may be used as the output electrode, and when the first electrode 150 is used as the output electrode, the second electrode 170 may be used as the input electrode.

The second electrode 170 may be formed of, for example, a conductive material such as molybdenum (Mo) or an alloy thereof. However, the second electrode 170 is not limited to such a composition, and may be formed of a conductive material such as ruthenium (Ru), tungsten (W), iridium (Ir), platinum (Pt), copper (Cu), titanium (Ti) tantalum (Ta), nickel (Ni), chromium (Cr), or the like, or alloys thereof.

The insertion layer 180 may be formed between the first electrode 150 and the piezoelectric layer 160. The insertion layer 180 may be formed of a dielectric material such as silicon dioxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), hafnium oxide ($HfO_2$), titanium oxide ($TiO_2$), zinc oxide (ZnO), or the like, but may be formed of a material different from that of the piezoelectric layer 160. A region, in which the insertion layer 180 is provided, may be formed as the air, as necessary. The air may be implemented by removing the insertion layer 180 in a manufacturing process.

The insertion layer 180 may be formed to have a thickness the same as or similar to a thickness of the first electrode 150. The insertion layer 180 may be formed to have a thickness similar to or smaller than a thickness of the piezoelectric layer 160. For example, the insertion layer 180 may be formed to have a thickness of 100 angstroms or more, and may be formed to have a thickness smaller than the thickness of the piezoelectric layer 160. However, a configuration of the insertion layer 180 and the piezoelectric layer 160 is not limited to such a configuration.

The insertion layer 180 may be disposed along a surface formed by the membrane layer 140, the first electrode 150, and the etching prevention portion 130.

The insertion layer 180 may be disposed in the vicinity of the flat portion S and support the bent portion 164 of the piezoelectric layer 160. Therefore, the bent portion 164 of the piezoelectric layer 160 may be divided into the inclined portion 164a and the extended portion 164b along the shape of the insertion layer 180.

The insertion layer 180 may be disposed in a region except for the flat portion S. For example, the insertion layer 180 may be disposed over the entirety of the region except for the flat portion S, or may be disposed in a portion of the region except for the flat portion S.

At least a portion of the insertion layer 180 may be disposed between the piezoelectric layer 160 and the first electrode 150.

A side surface of the insertion layer 180 disposed along a boundary of the flat portion S may have a thickness that becomes greater away from the flat portion S. Therefore, the side surface of the insertion layer 180 disposed adjacent to the flat portion S may be formed as the inclined surface L having a predetermined inclined angle θ.

When the inclined angle θ of the side surface of the insertion layer 180 is smaller than 5 degrees, a thickness of the insertion layer 180 needs to significantly small or an area of the inclined surface L needs to be excessively large to manufacture the insertion layer 180 of which the inclined angle θ of the side surface is smaller than 5 degrees, which is substantially difficult to be implemented.

When the inclined angle θ of the side surface of the insertion layer 180 is larger than 70 degrees, an inclined angle of the inclined portion 164a of the piezoelectric layer 160 stacked on the insertion layer 180 may be larger than 70 degrees. In this case, the piezoelectric layer 160 is excessively bent, such that cracking may occur in the bent portion of the piezoelectric layer 160.

Therefore, in this example, the inclined angle θ of the inclined surface L may be in a range of 5 degrees or more to 70 degrees or less.

The passivation layer 190 may be formed in regions except for portions of the first electrode 150 and the second electrode 170 (for example, in regions other than those in which the first electrode 150 and the second electrode 170 overlap each other). The passivation layer 190 may serve to prevent damage to the second electrode 170 and the first electrode 150 during a process.

Further, a portion of the passivation layer 190 may be etched and removed in order to adjust a frequency in a final process. For example, a thickness of the passivation layer 190 may be adjusted. For example, a dielectric layer containing one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the passivation layer 190.

The metal pad 195 may be formed in portions of the first and second electrodes 150 and 170 in which the passivation layer 190 is not formed. As an example, the metal pad 195 may be formed of a material such as gold (Au), a gold-tin (Au—Sn) alloy, copper (Cu), a copper-tin (Cu—Sn) alloy, aluminum (Al), an aluminum alloy, or the like. For example, the aluminum alloy may be an aluminum-germanium (Al—Ge) alloy.

As illustrated in FIG. 2, the metal pad 195 may include a first metal pad 195a having an edge portion 195a1 and a second metal pad 195b disposed to oppose the first metal pad 195a.

As illustrated in FIG. 2, a rectangle surrounding an active region is formed, and one side of the rectangle connected to the metal pad 195 will be defined as side B, and another side thereof will be defined as side A. For example, an active region is disposed inside and, when the active region is viewed from above, among fourth sides of the rectangle with which at least three vertices of a polygon formed by the active region are in contact, a longest side will be defined as a side B and a side connected to side B will be defined as a side A. The term "active region" refers to a region in which the first electrode 150, the piezoelectric layer 160, and the second electrode 170 are all disposed to overlap each other.

In addition, an aspect ratio will be defined as side B/side A.

As illustrated in FIG. 2, the metal pad 195 is disposed to cover the active region.

TABLE 1

| Side B/Side A | $Kt^2$ (%) | Atten (dB) | IL (dB) |
| --- | --- | --- | --- |
| 0.13 | 12.64 | 29.24 | 0.436 |
| 0.57 | 12.39 | 29.72 | 0.122 |
| 0.92 | 12.23 | 29.87 | 0.082 |
| 1.29 | 12.08 | 29.81 | 0.061 |
| 1.69 | 11.97 | 29.49 | 0.049 |
| 2.12 | 11.88 | 28.85 | 0.040 |
| 2.57 | 11.85 | 27.85 | 0.034 |
| 2.93 | 11.85 | 26.82 | 0.031 |
| 3.33 | 11.89 | 25.42 | 0.027 |
| 3.73 | 11.97 | 23.75 | 0.025 |
| 4.13 | 12.09 | 21.81 | 0.023 |

Figure 3:
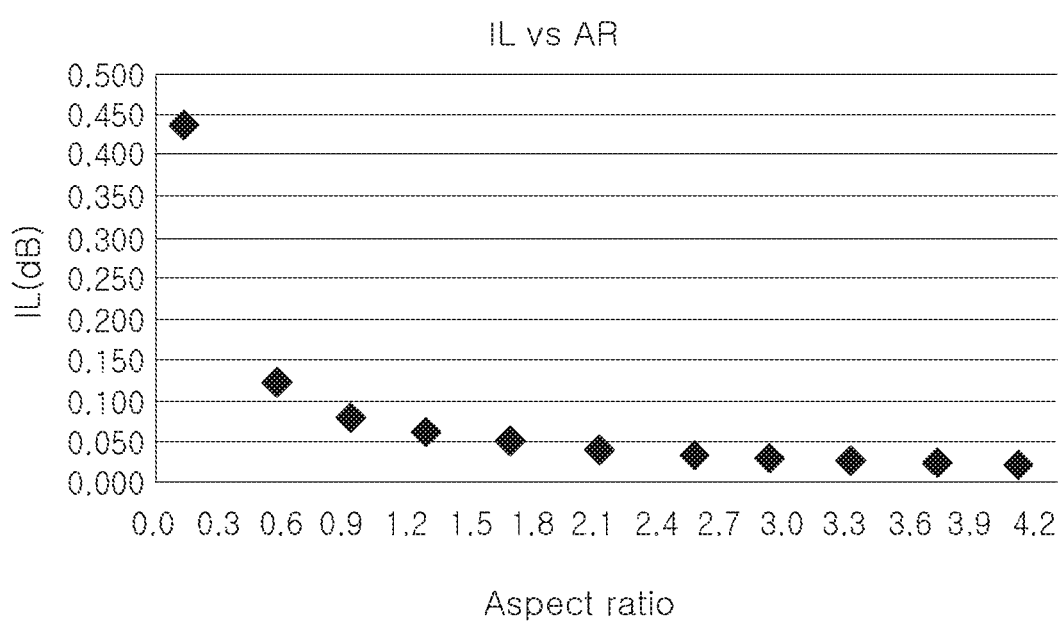
FIG. 3 is a graph showing insertion loss IL characteristics depending on an aspect ratio.
Figure 4:
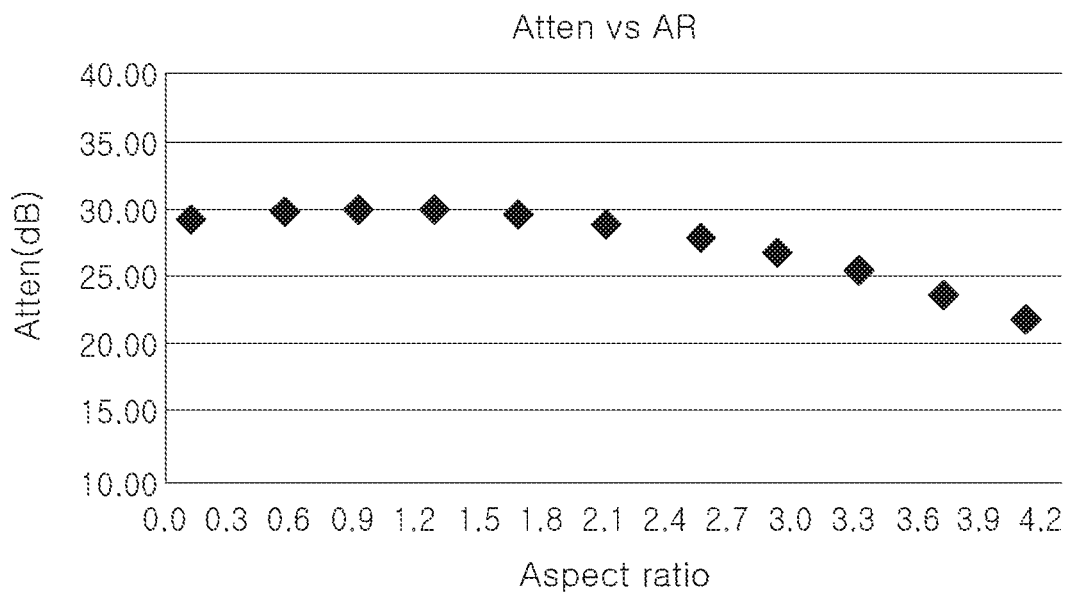
FIG. 4 is a graph showing attenuation performance depending on an aspect ratio.
Figure 5:
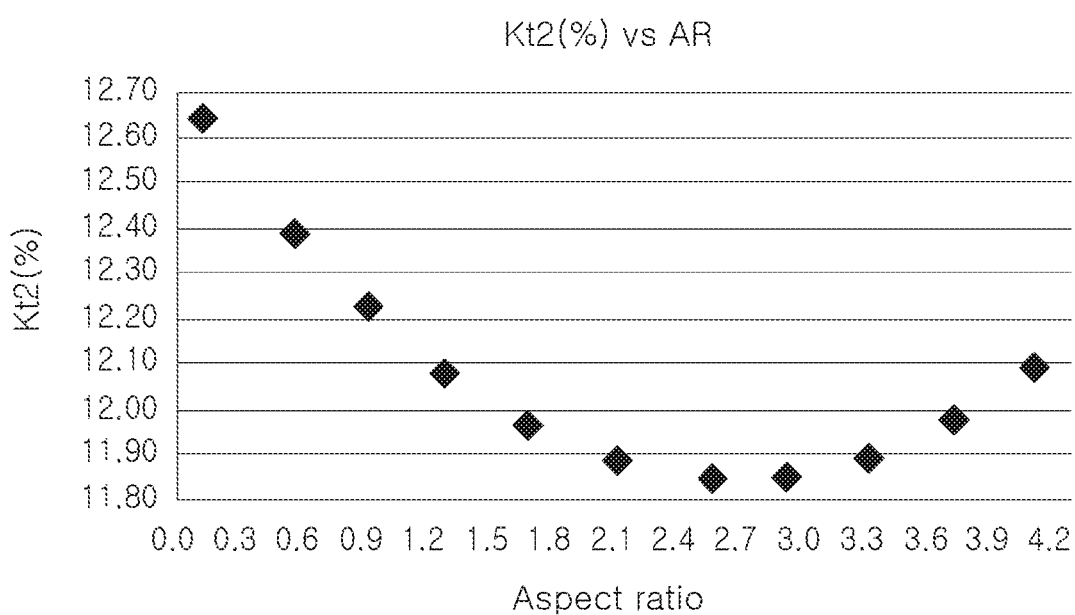
FIG. 5 is a graph showing $Kt^2$ performance depending on an aspect ratio.

Graphs based on data listed in Table 1 above are illustrated in FIGS. 3 to 5.

From FIG. 3, it can be seen that insertion loss IL is reduced and attenuation performance (Atten.) and $Kt^2$(%) are deteriorated as the aspect ratio is increased.

Figure 6:
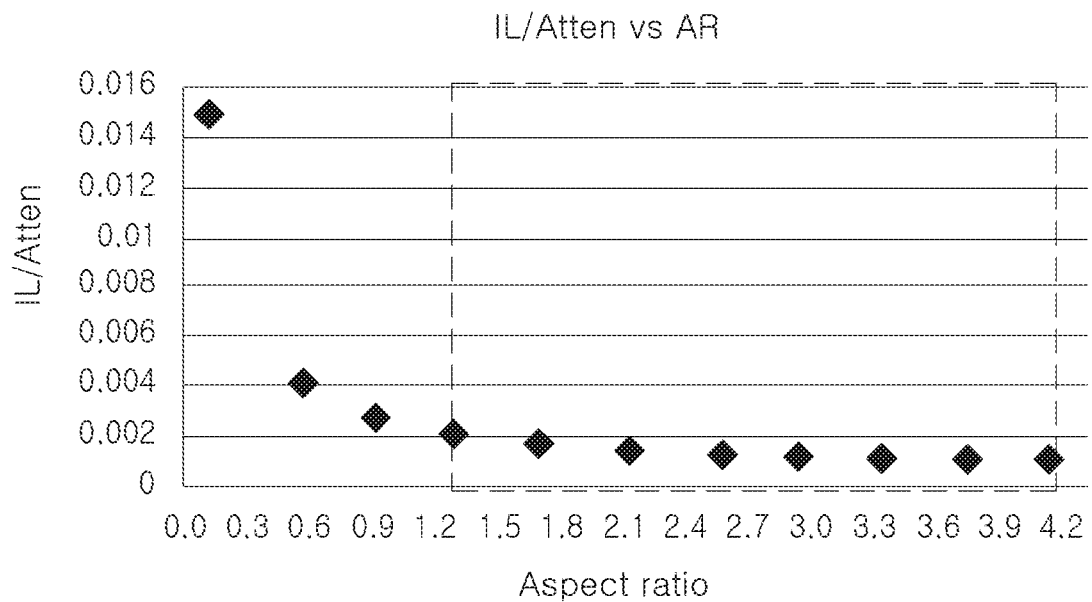
FIG. 6 is a graph showing an IL/Atten value depending on an aspect ratio.
Figure 7:
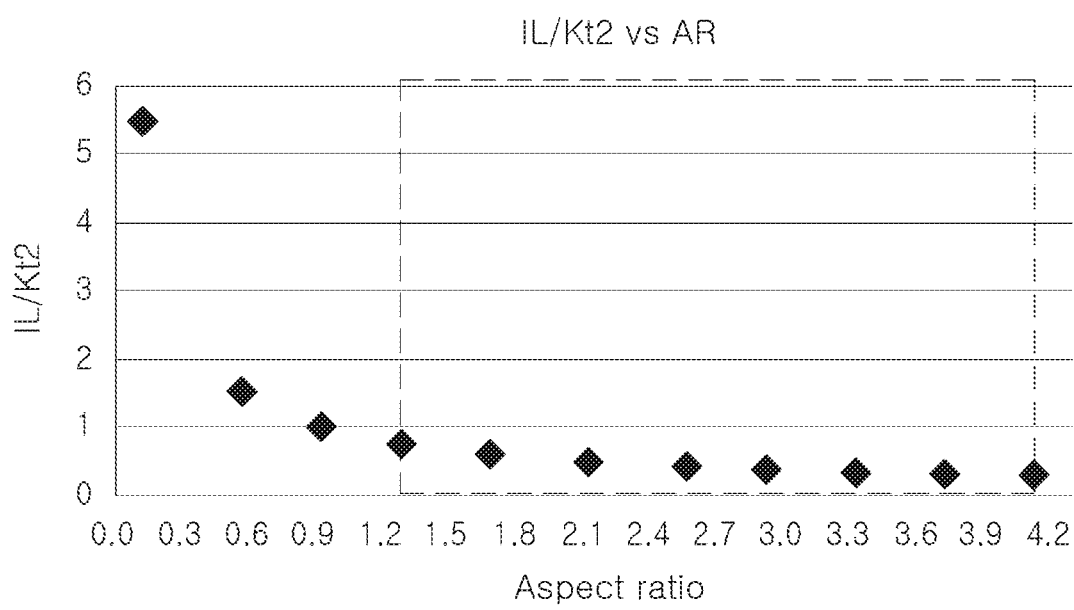
FIG. 7 is a graph showing an IL/$Kt^2$ value depending on an aspect ratio.

As illustrated in FIGS. 4 and 5, attenuation performance (Atten.) and $Kt^2$(%) are deteriorated. Hence, as illustrated in FIGS. 6 and 7, when comparing a value of IL/Atten and a value of IL/$Kt^2$ with each other, both of the two values (the value of IL/Atten and the value of IL/$Kt^2$) show a gentle trend at an aspect ratio of 1.3 or more. Therefore, the aspect ratio may be, in detail, 1.3 or more.

Figure 8:
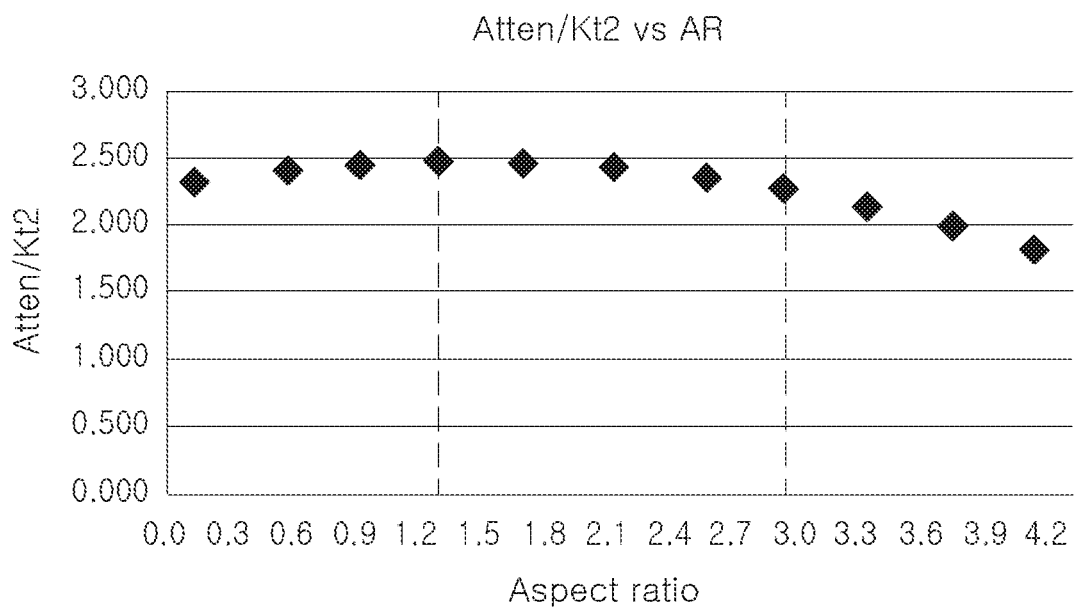
FIG. 8 is a graph showing an Atten/$Kt^2$ value depending on an aspect ratio.

Further, when the aspect ratio is 3 or more, an active region has a quadrangular or higher polygonal outer shape, but may have a shape close to a triangular shape as it is elongated. For this reason, reflection characteristics of a transverse wave are significantly interfered with at an acute corner portion of the triangular shape. As illustrated in FIG. 8, when the value of Atten/$Kt^2$ is checked, an aspect ratio starts to be decreased from 3 or more.

Therefore, the aspect ratio has a value ranging from 1.3 to 3.

Figure 9:
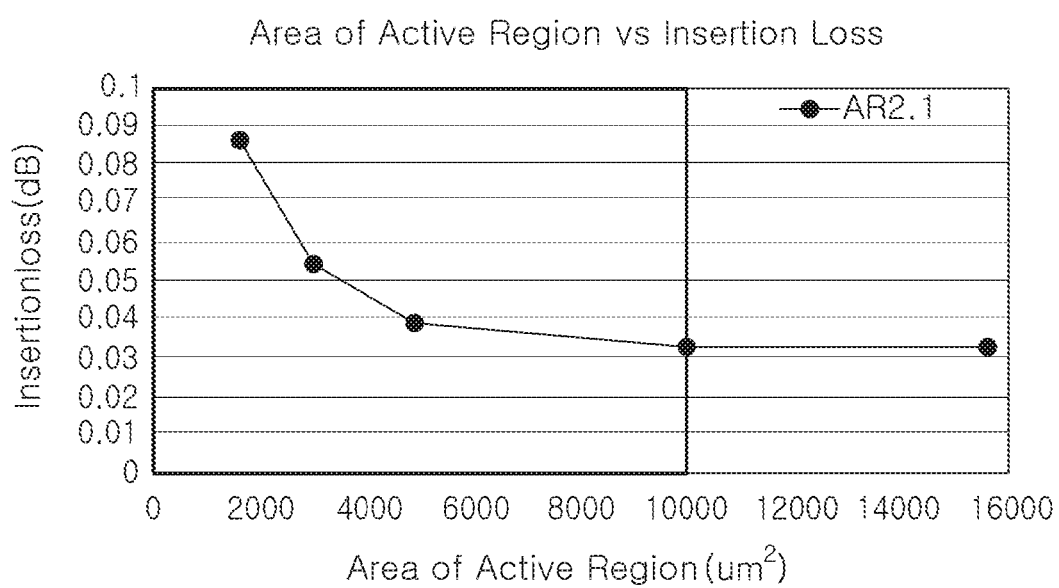
FIG. 9 is a graph showing an IL value depending on an area of an active region.

From FIG. 9, it can be seen that when the active area is viewed from above, a reduction in insertion loss IL is prominent as an area of the active area is decreased to 10000 μm2 or less. Therefore, it can be seen that under a condition in which the aspect ratio has a value ranging from 1.3 to 3, an effect of reducing the insertion loss IL is improved as the area of the active region is decreased to 10000 μm2 or less.

Figure 10:
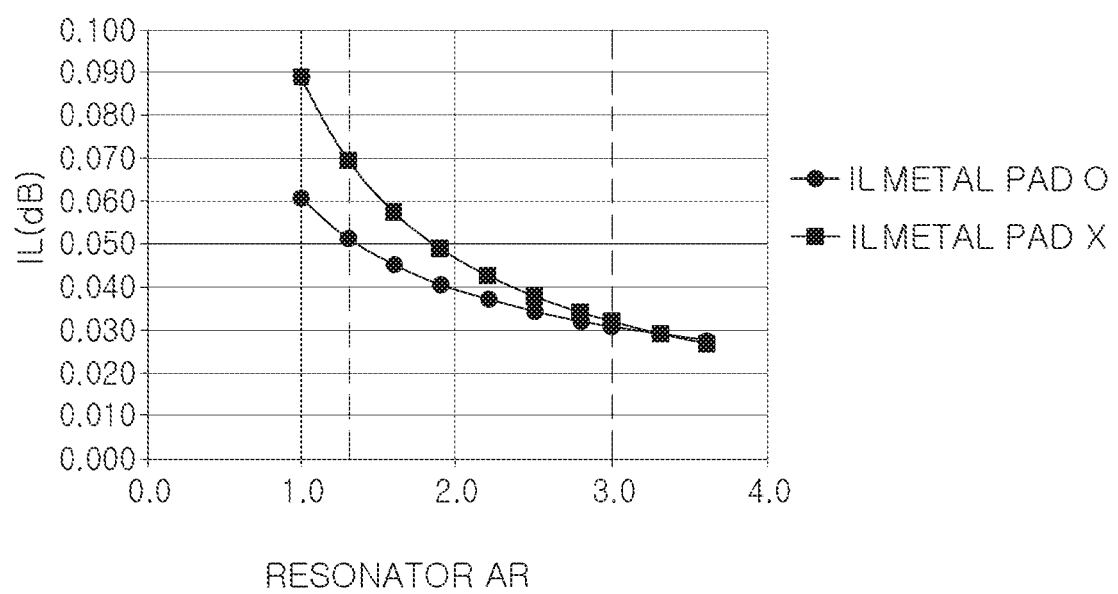
FIG. 10 is a graph showing IL characteristics depending on an aspect ratio, depending on whether a metal pad is present.

From FIG. 10, it can be seen that since an aspect ratio has a value ranging from 1.3 to 3 while a metal pad 195 is disposed to cover the active area, IL performance is further performed by the metal pad 195. That is, it can be seen that when the aspect ratio is 3.0 or more, there is no effect arising from the metal pad 195.

Therefore, a bulk-acoustic wave resonator 100 is manufactured such that the aspect ratio of the active region has a value ranging from 1.3 to 3 while the metal pad 195 is disposed to surround the active region.

Accordingly, as described above, insertion loss IL may be reduced while inhibiting a decrease in attenuation performance and Kt$^2$ characteristics.

Figure 11:
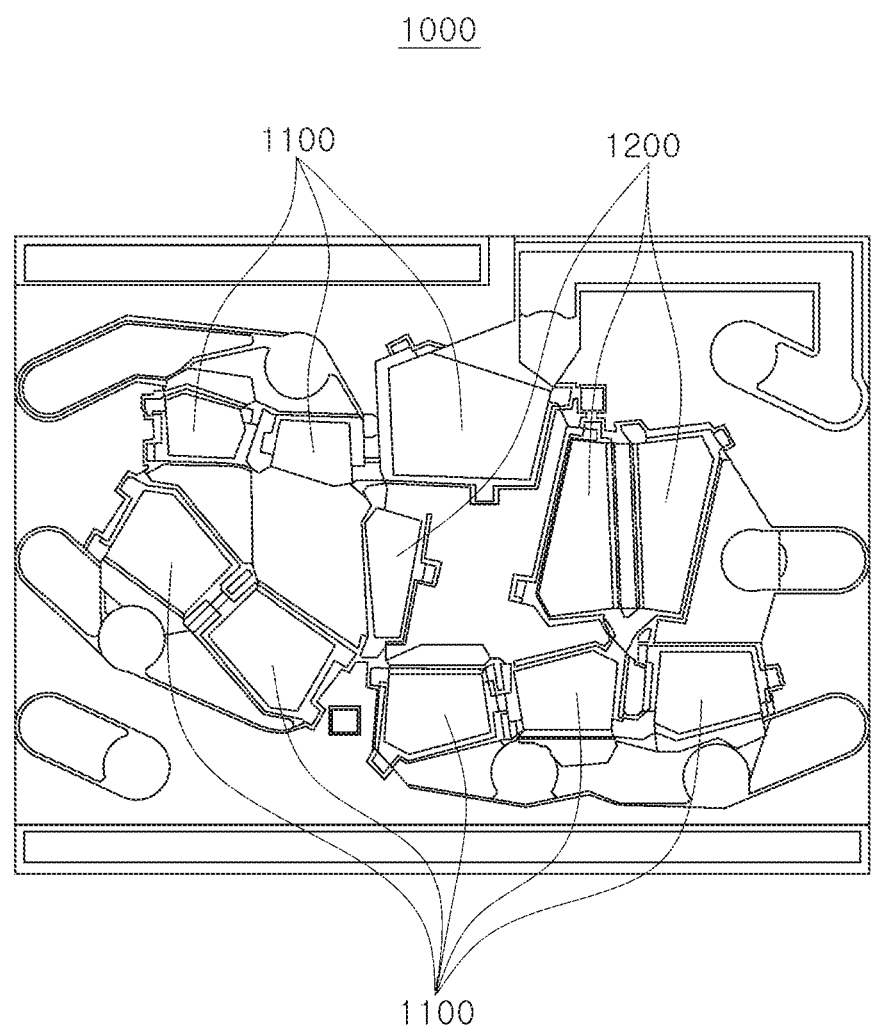
FIG. 11 is a plan view of a bulk-acoustic wave filter device according to an example.

FIG. 11 is a plan view of a bulk-acoustic wave filter device according to an example.

Referring to FIG. 11, a bulk-acoustic wave filter device 1000 may include, for example, a plurality of series resonators 1100 and a plurality of shunt resonators 1200. The plurality of series resonators 1100 and the plurality of shunt resonators 1200 may be connected to each other.

The plurality of series resonators 1100 and the plurality of shunt resonators 1200 may each have an aspect ratio of 1.3 to 3. The plurality of series resonators 1100 and the plurality of shunt resonators 1200 are provided with metal pads 195 (see FIGS. 1 and 2). In addition, the metal pad 195 is disposed to cover active regions provided in the plurality of series resonators 1100 and the plurality of shunt resonators 1200.

As an example, the aspect ratio of the series resonator 1100 may have a smaller value than the aspect ratio of the shunt resonator 1200.

Figure 12:
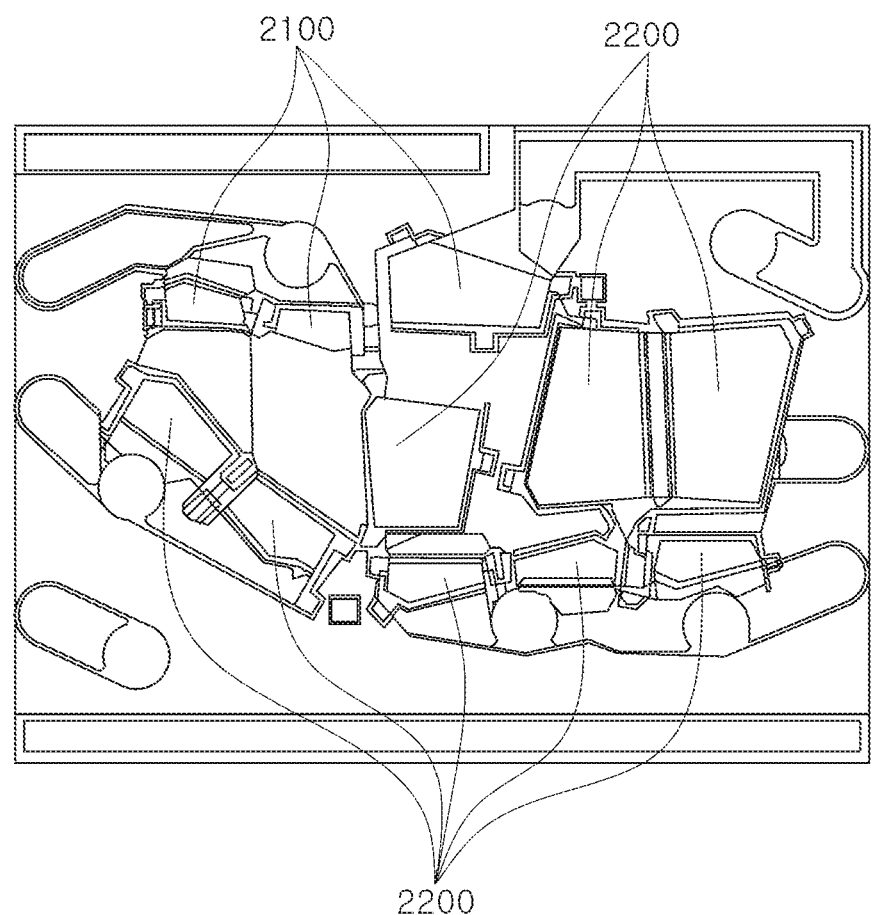
FIG. 12 is a plan view of a bulk-acoustic wave filter device according to another example.

FIG. 12 is a plan view of a bulk-acoustic wave filter device according to another example.

Referring to FIG. 12, a bulk-acoustic wave filter device 2000 may include, for example, a plurality of series resonators 2100 and a plurality of shunt resonators 2200. The plurality of series resonators 2100 and the plurality of shunt resonators 2200 may be connected to each other.

The plurality of series resonators 2100 and the plurality of shunt resonators 2200 may each have an aspect ratio of 1.3 to 3. The plurality of series resonators 2100 and the plurality of shunt resonators 2200 are provided with metal pads 195 (see FIGS. 1 and 2). In addition, the metal pad 195 is disposed to cover active regions provided in the plurality of series resonators 2100 and the plurality of shunt resonators 2200.

As an example, the aspect ratio of the series resonator 2100 may have a greater value than the aspect ratio of the shunt resonator 2200.

However, as a non-limiting example, among the plurality of series resonators 2100 and the plurality of shunt resonators 2200, a resonator requiring IL characteristics may be formed to have a large aspect ratio. Among the plurality of series resonators 2100 and the plurality of shunt resonators 2200, a resonator requiring significantly improved attenuation or Kt$^2$ performance may be formed to a small aspect ratio.

As described above, a decrease in attenuation performance and Kt$^2$ characteristics may be inhibited while reducing insertion loss IL.

While this disclosure includes specific examples, it will be apparent after an understanding of the disclosure of this application that various changes in forms and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator comprising:
   a substrate;
   a first electrode disposed on the substrate;
   a piezoelectric layer covering at least a portion of the first electrode; and
   a second electrode covering at least a portion of the piezoelectric layer,
   wherein an active region, in which the first electrode and the second electrode overlap each other, is enclosed by a polygon when the bulk-acoustic wave resonator is viewed from above, and
   wherein when a rectangle is drawn such that three vertices of the polygon are in contact with three sides of the rectangle and one side of the polygon extends within a remaining side of the rectangle, a longest side of the rectangle is defined as a side B, and a side connected to the side B is defined as a side A, an aspect ratio (side B/side A) is 1.3 to 3.

2. The bulk-acoustic wave resonator of claim 1, further comprising:
   a metal pad connected to the first electrode and the second electrode.

3. The bulk-acoustic wave resonator of claim 2, wherein the metal pad comprises a first metal pad, having an edge portion disposed to cover a portion of the active region, and a second metal pad disposed to oppose the first metal pad.

4. The bulk-acoustic wave resonator of claim 2, wherein the first metal pad is connected to the first electrode, and the second metal pad is connected to the second electrode.

5. The bulk-acoustic wave resonator of claim 1, further comprising:
   a membrane layer or a seed layer disposed between the substrate and the first electrode, and defining a cavity together with the substrate.

6. The bulk-acoustic wave resonator of claim 5, further comprising:
   an etching prevention portion disposed to cover the cavity.

7. The bulk-acoustic wave resonator of claim 6, further comprising:
   a sacrificial layer disposed outside of the etching prevention portion.

8. The bulk-acoustic wave resonator of claim 1, further comprising:

an insertion layer disposed between the first electrode and the piezoelectric layer.

9. The bulk-acoustic wave resonator of claim 1, wherein the piezoelectric layer is formed of aluminum nitride (AlN) or aluminum nitride (AlN) doped with a dopant.

10. The bulk-acoustic wave resonator of claim 9, wherein the dopant comprises at least one selected from the group consisting of scandium (Sc), erbium (Er), yttrium (Y), lanthanum (La), titanium (Ti), zirconium (Zr), hafnium (Hf), tantalum (Ta), and niobium (Nb), or combinations thereof.

11. The bulk-acoustic wave resonator of claim 1, wherein an area of the active region is 10000 $\mu m^2$ or less when the active region is viewed from above.

12. A bulk-acoustic wave filter device comprising:
a substrate;
a plurality of series resonators disposed on the substrate; and
a plurality of shunt resonators connected to the plurality of series resonator on the substrate,
wherein, in each of the plurality of series resonators and the plurality of shunt resonators, an active region is enclosed by a polygon when the bulk-acoustic wave resonator is viewed from above, and
wherein when a rectangle is drawn such that three vertices of the polygon are in contact with three sides of the rectangle and one side of the polygon extends within a remaining side of the rectangle, a longest side of the rectangle is defined as a side B, and a side connected to the side B is defined as a side A, an aspect ratio (side B/side A) is 1.3 to 3.

13. The bulk-acoustic wave filter device of claim 12, wherein
each of the series resonators and the shunt resonators comprises a metal pad connected to a first electrode and a second electrode.

14. The bulk-acoustic wave filter device of claim 13, wherein the metal pad comprises a first metal pad, having an edge portion disposed to cover a portion of the active region, and a second metal pad disposed to oppose the first metal pad.

15. The bulk-acoustic wave filter device of claim 12, wherein the aspect ratio of each of the plurality of series resonators is greater than the aspect ratio of each of the plurality of shunt resonators.

16. The bulk-acoustic wave filter device of claim 12, wherein the aspect ratio of each of the plurality of series resonators is smaller than the aspect ratio of each of the plurality of shunt resonators.

17. The bulk-acoustic wave filter device of claim 12, wherein an area of the active region is 10000 $\mu m^2$ or less when the active region is viewed from above.

* * * * *